United States Patent [19]
Brown et al.

[11] 4,000,468
[45] Dec. 28, 1976

[54] PROGRAMMABLE SIGNAL SEEKING RADIO RECEIVER

[75] Inventors: John R. Brown, Mount Comfort; Anisur R. Khan, Indianapolis, both of Ind.

[73] Assignee: Teaberry Electronics Corporation, Indianapolis, Ind.

[22] Filed: Sept. 20, 1973

[21] Appl. No.: 399,079

[52] U.S. Cl. .............................. 325/335; 325/470
[51] Int. Cl.² ......................................... H04B 1/32
[58] Field of Search .......... 325/334, 335, 468, 469, 325/470, 419–423, 456, 464, 465; 331/18, 22, 30, 31

[56] References Cited
UNITED STATES PATENTS

| | | | |
|---|---|---|---|
| 3,665,318 | 5/1972 | Hoffman | 325/470 |
| 3,750,032 | 7/1973 | Andrews | 325/334 |
| 3,803,495 | 4/1974 | Reynolds | 325/470 |
| 3,835,384 | 9/1964 | Liff | 325/419 X |
| 3,864,637 | 2/1975 | Kanow | 325/470 |
| 3,882,400 | 5/1975 | Hamada | 325/456 |
| 3,883,807 | 5/1975 | Alberkrack | 325/464 |
| 3,940,702 | 2/1976 | Yoshimura et al. | 325/470 |

*Primary Examiner*—Benedict V. Safourek
*Attorney, Agent, or Firm*—Jenkins, Hanley & Coffey

[57] ABSTRACT

A signal-seeking radio receiver is provided which utilizes a single crystal to establish a reference frequency and digital selection means coupled thereto, for selecting a plurality of predetermined and programmed frequencies from the plurality of frequencies in the high frequency (HF), the very high frequency (VHF) and the ultra high frequency (UHF) radio bands that are monitored for broadcast signals on those predetermined frequencies. All of these predetermined frequencies are scanned and, when one of said plurality of predetermined frequencies carries a broadcast signal thereon, the receiver is operable to broadcast that signal in its entirety. The receiver relies upon a singular antenna configuration for reception of all frequencies in the three bands. The absence of a signal on one of the predetermined frequencies allows the receiver and the digital selection circuits therein to rapidly and continually scan the predetermined frequencies in any or all of the three radio bands until one of the predetermined frequencies contains such a signal.

6 Claims, 6 Drawing Figures

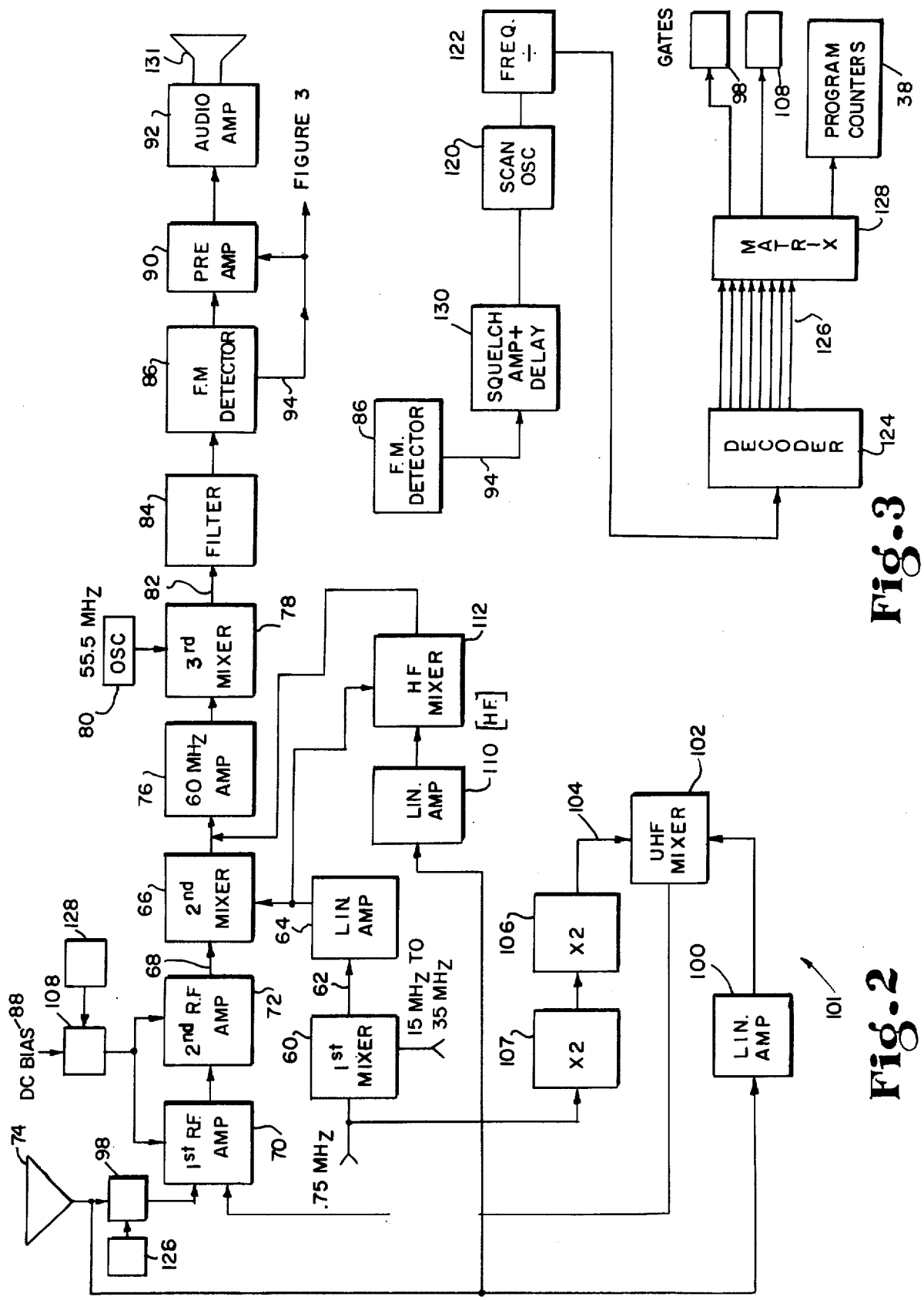

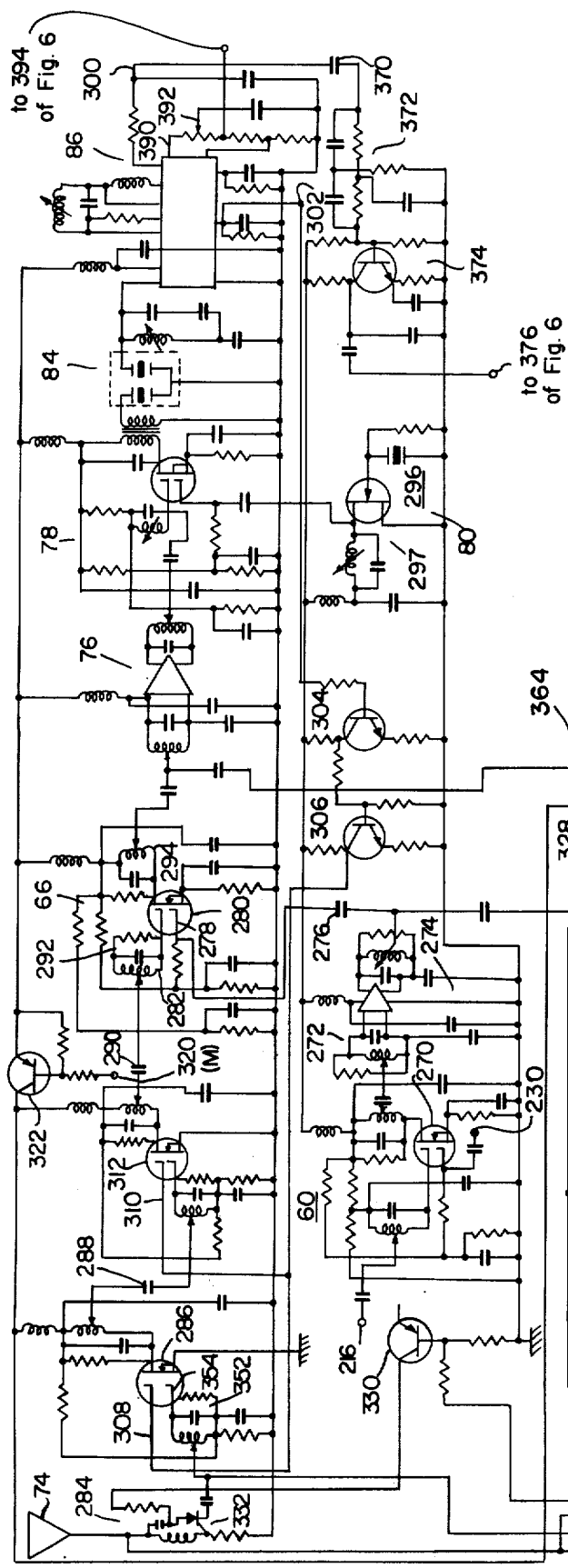
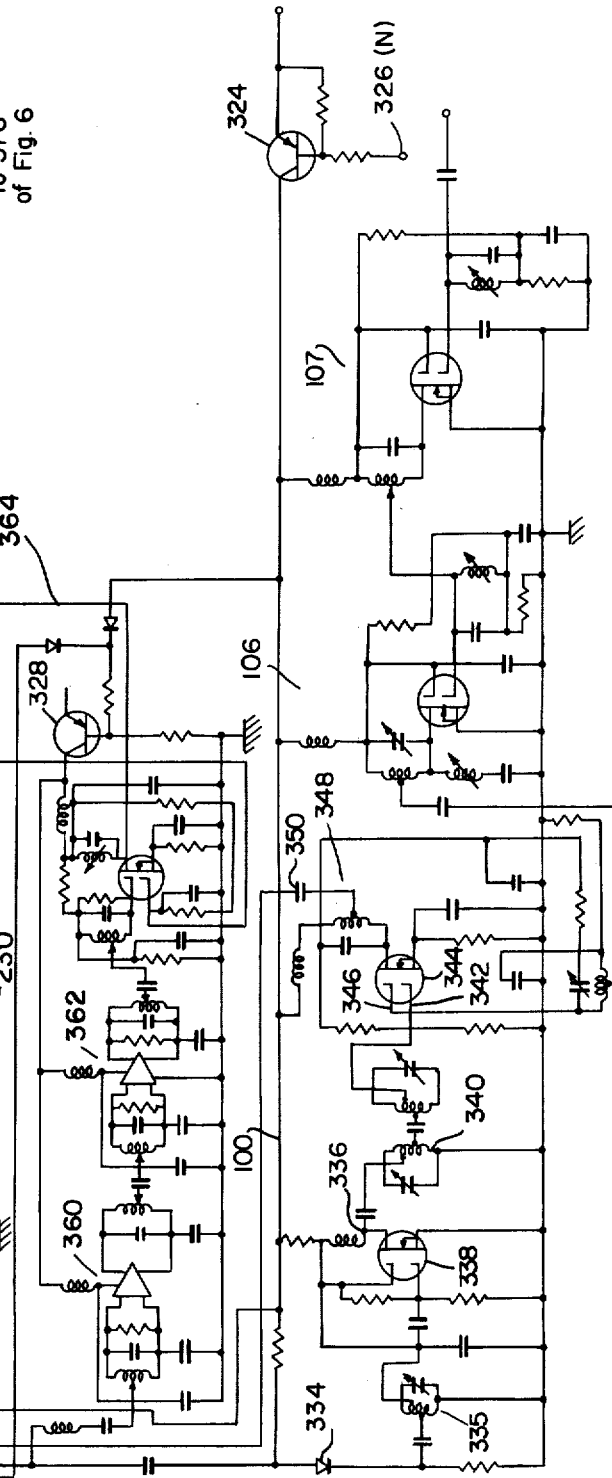
Fig. 5

PROGRAMMABLE SIGNAL SEEKING RADIO RECEIVER

BACKGROUND OF THE INVENTION

The present invention relates to signal-seeking receivers which are completely electronic in nature and which are utilized for a plurality of various applications where a single radio frequency band or a number of radio frequency bands are monitored for locating and receiving predetermined signal frequencies.

Electronic signal-seeking receivers have conventionally been comprised of a plurality of local oscillators which are respectively tuned to a predetermined frequency so that the receiver can receive such predetermined frequencies to the exclusion of all others. Such receivers, in the past, have required a separate crystal for each frequency to be received. These crystals, one which is required for each frequency to be received, are expensive, and thus proportionately increase the cost of such receivers.

Secondly, such receivers have been severely limited in the number of frequencies which can be received, since such receivers are typically broad band in nature and do not have the sensitivity to receive all of the frequencies in the HF, VHF and UHF bands.

The prior art receivers are either limited to a single frequency band, i.e., HF, VHF or UHF, or if such receiver is capable of receiving signals from two or more bands, the receiver has always utilized a separate antenna for each such band to be received. Coupled with each antenna is the required RF amplifier and mixer stages. This also increases the cost, and ultimately the sales price, of such receivers which makes them undesirable for use by the majority of consumers.

It is, therefore, desirable to provide a signal-seeking receiver which does not utilize a plurality of specially configured oscillators containing crystals to select the desired signal frequencies; which relies only on a single antenna for reception of the signals in a plurality of radio bands, minimizes the content and the cost of the electronics heretofore involved.

SUMMARY OF THE INVENTION

A programmable signal-seeking radio receiver is provided which relies upon a digital programming technique to establish predetermined frequencies in the HF, VHF and UHF radio frequency bands which will be repetitively monitored for the purpose of broadcasting any of the predetermined and programmed frequencies when they contain a broadcast signal.

In accordance with the preferred embodiment, the invention utilizes a scanning oscillator to repetitively scan the input lines to a matrix configured circuit containing a plurality of output lines which normally have a different binary code imposed thereon as each of the input lines is scanned. The particular binary code that is associated with each of the input lines is predetermined by appropriately programming the matrix circuit.

At the time when each of the input lines to the matrix circuit is scanned the respective binary code is presented to and controls programmable counter circuitry. The counter circuitry is operative to generate a signal frequency that is compared with a reference signal frequency to appropriately alter the output frequency of a voltage controlled oscillator in accordance with the binary number programmed in the counter circuitry.

The output of the voltage controlled oscillator is thereby continually changed and, at any given time, the frequency of such output is indicative of the frequency which has been programmed and which is to be monitored at that particular point in time. The voltage controlled oscillator output is combined with the output of the main oscillator to establish a local oscillator frequency which thereafter establishes, by the use of mixing circuitry, when a programmed signal is received.

The particular band in which the programmed frequency is to be found is also programmed. The programming of such bands and the signals generated as a direct result thereof, establish, through a gating technique, the processing path for the incoming signals which are received by the single antenna that is utilized.

The scanning of the programmed frequencies is repetitively continued until it is detected that one of such frequencies contains a broadcast signal. At that time the scanning and the signal seeking processes are inhibited for the duration of that broadcast signal. Furthermore, in the absence of a broadcast signal on one of the predetermined frequencies, means are provided to disable the audio output from the receiver to prevent the presentation of any of the signal noise which is then present.

BRIEF DESCRIPTION OF DRAWINGS

The accompanying drawings illustrate the invention and, by way of example, show a preferred embodiment. In such drawings:

FIG. 2 is a block diagram illustrating the processing and monitoring of an RF signal by the inventive receiver;

FIG. 3 is a block diagram showing the scanning and programming of the predetermined frequencies;

FIG. 5 is a circuit diagram showing the electronic circuits embodied in the block diagram of FIG. 2;

DETAILED DESCRIPTION OF THE PREFERRED EMBODIMENT

This invention relates to an electronic signal-seeking radio receiver which includes means for digitally programming and scanning the specific frequencies to be monitored and broadcast. The reception of one of these frequencies will inhibit the signal-seeking process until such frequency no longer contains a broadcast signal. A single antenna is used in the receiver to receive frequency signals in the high frequency band, i.e., 30 to 50 megahertz, the VHF band, i.e., 150 to 170 megahertz, and in the UHF band which is in the range of 450 to 470 megahertz. The specific frequencies which will cause the scanning process to stop if they have a broadcast signal imposed thereon, are predeterminably programmed by a matrix method.

Figure 1:
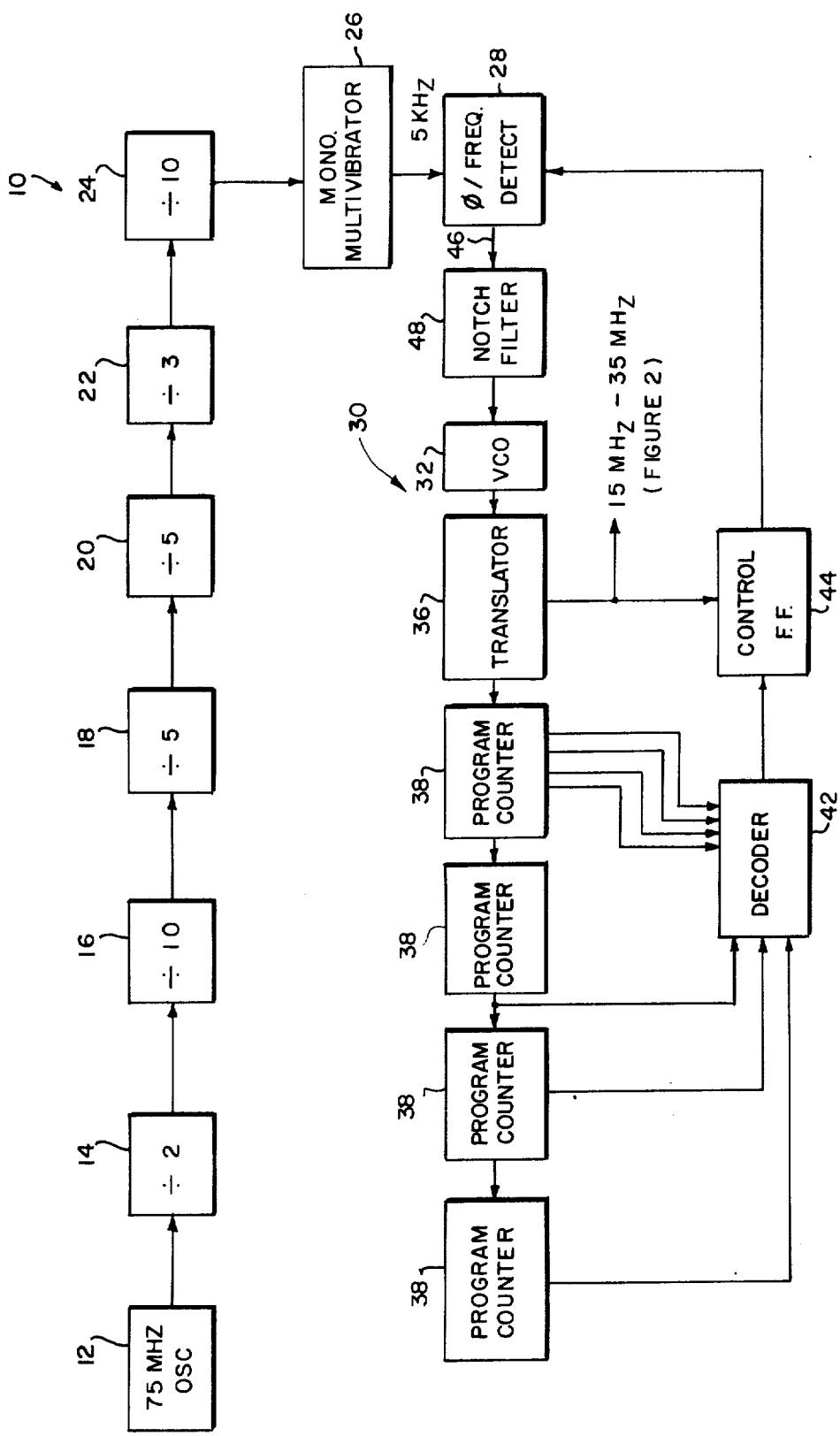
FIG. 1 is a block diagram of the circuitry which is utilized to generate frequency signals that are indicative of frequencies that are programmed.

More specifically, and with reference to the drawings, FIG. 1 shows a block diagram of frequency synthesizer which is programmable to preselect the particular plurality of frequencies which are monitored for incoming, broadcast signals. The synthesizer 10 has a capability of scanning all of the 12,000 channels contained in the HF, VHF and UHF bands. The plurality of preselected and programmed frequencies are taken from these 12,000 possible channels. The synthesizer relies on a 75 MHZ oscillator 12 for providing a reference signal of very stable frequency to serve as the basis for the scanning of the particular frequencies that have been programmed and the monitoring of incoming signals for broadcasts on those frequencies.

In general terms, and with reference to FIG. 1, the frequency of the 75 MHZ signal is first divided in half by a divider 14, then by ten in a ten's divider 16, and subsequently by a five's divider 18, by a second five's divider 20, by a three's divider 22, and finally by a second ten's divider 24. The net result is a precise 5 kilohertz signal that is available at the output of the last ten's divider 24. This 5 KHZ signal is then passed through a monostable multivibrator device such as a one-shot 26 to shape the wave form such that the positive pulses have a duration of approximately 50 nanoseconds. The 5 KHZ signals, each positive pulse of which is 50 nanoseconds in duration, is then supplied to a phase and frequency detector 28 as the reference frequency signal.

The phase and frequency detector 28 is included in, and forms part of, a feedback circuit 30, which is responsible for generating frequencies that are indicative of the programmed frequencies. A voltage controlled oscillator 32 is, at any given time, supplying an output line with signals having a frequency between about 15 and 35 MHZ. This oscillatory signal passes through a translator 36 before being applied to a series of programmable counters 38 to clock these counters. These counters 38 are programmed in a fashion which will be fully described hereinafter, but for the moment, it is sufficient to say that they are programmed.

The output of the programmable counters 38 is passed through a decoder 42 which decodes a predetermined count from the decoders. The output of the decoder 42 is applied to a flip-flop (FF) 44 to generate a signal at the output of the FF 44 having frequency that is representative of the VCO frequency divided by the number of counts which the programmable counters had to count to reach the predetermined count. The frequency signal from the FF 44 is applied to the phase and frequency detector 28 where it is compared with the 5 KHZ reference frequency.

If the frequency of the signal from the control FF 44 is greater than 5 KHZ, the DC output voltage 46 of the phase and frequency detector 28 goes down in amplitude. On the other hand, if the frequency of the signal from the control FF 44 is less than 5 KHZ the DC voltage output of the phase and frequency detector 28 goes up.

The respective DC output from the phase and frequency detector 28 is applied, through a notch filter 48, to the voltage controlled oscillator (VCO) 32. The notch filter blocks any 5 KHZ signals that are possibly imposed on the DC voltage to prevent any deviations in the subsequently generated signals.

The VCO 32 is responsive to the proportionate DC voltage from the phase and frequency detector 28 to alter its output frequency, which again is between 15 and 35 MHZ, to bring the output of the control FF 44 into congruence with the 5 KHZ reference frequency.

The repetitive change of the programmed number in the programmable counters 38 is effective to change the output frequency of the VCO in the above described manner, with only an infinitesimal amount of time being required for the stabilization of the VCO frequency each time it is changed.

With reference to FIG. 2, the output of the VCO 32, which is now somewhere between 15 and 35 MHZ, depending upon the number programmed in the programmable counters 38, is supplied to a RF mixer 60 along with a 75 MHZ signal coming directly from the 75 MHZ reference oscillator 12. This first mixer 60 is effective to mix the two frequencies together thereby placing a signal on its output 62 which has a frequency content between 90 and 110 MHZ. This 90 to 110 MHZ signal is used as the local oscillator frequency and is passed through a tuned, linear amplifier 64 for amplification of the signal.

When the programmed frequency is programmed to be in the VHF band, in a manner to be described, the output of the 90–110 MHZ amplifier is applied to a second mixer 66. The other input 68 to the second mixer 66 is obtained, by means of two radio frequency amplifiers 70 and 72, from the only antenna 74 which is utilized in the receiver.

The second mixer 66 is effective to mix the 150 to 170 MHZ signals received from the antenna 74 and the 90 to 110 MHZ signals received from the first mixer 60 to generate a 60 MHZ signal. It should be understood that the required 60 MHZ signal will only be generated by the second mixer 66 when the programmed local oscillator frequency which is the 90 to 110 MHZ signal coming from the first mixer 60 is in the proper relationship with the signal being received by the antenna 74.

The 60 MHZ signal from the second mixer 66 is passed through a tuned amplifier 76 and is applied to a third mixer 78. The other input to the third mixer 78 is received from a 55.5 MHZ crystal controlled oscillator 80. These two signals, when presented to the third mixer 78, are effective to generate a 4.5 MHZ signal on the ouput of the mixer 82.

The output of the third mixer is coupled, by a crystal filter 84, to an FM quadrature detector 86. The crystal filter 84 has a band width of 7 KHZ and is effective to eliminate problems with adjacent channels to insure that the signal is entirely that of the programmed frequency.

The FM detector 86 is responsible for controlling and generating a plurality of parameter signals. The FM detector 86 contains a saturation detector which, when the incoming signal from the antenna 74 is substantially large in amplitude, places a signal on an automatic gain control (AGC) line 88 which proportionately reduces the gain of the first and second RF amplifiers 70 and 72.

The FM detector is also coupled through low pass preamps 90 to an audio amplifier 92 for presentation of the desired signal via the speaker 93. Thirdly, the FM detector 86 is also used as a squelch detector and originates a signal when only noise or static is present on the incoming programmed frequency channels to turn off the low pass amplifier 90 so that such noise is not broadcast through the speaker 93. On the other hand, when a desired signal is present and is available to the detector 86, the squelch output line 94 from the FM detector 86 causes a scanning oscillator 120 to which it is coupled to stop its scanning process.

The signal path and processing from the antenna 74 to the audio amplifier 92, as above descrived, is that used for the reception of the VHF band. As previously mentioned, the inventive receiver utilizes only a single antenna for reception of the three radio frequency bands, i.e., HF, UHF and VHF.

Turning now to the UHF band which contains frequencies between 450 and 470 MHZ, the programming of the programmable counters (FIG. 1) to receive a frequency in the UHF band is effective, when monitoring for a signal having that frequency, and as shall be made more clear hereinafter, to operate a gate 98 which eliminates the incoming antenna signal from the VHF first stage RF amplifier 70, but which provides such signal to a tuned RF amplifier 100 in the VHF Section 101 for amplification. The amplified signal is thereafter supplied to a UHF mixer 102 for mixing the 450 to 470 MHZ signal with a 300 MHZ signal that is used as the other input 104 to the mixer 102. The 300 MHZ signal is obtained by twice doubling, by means of doublers 106 and 107, the 75 MHZ reference signal from the 75 MHZ crystal oscillator shown in FIG. 1.

As thus far described, only one amplifier 100 is used to amplify the incoming UHF signal. The reason for this is that the output of the UHF mixer 102 is coupled to the first RF amplifier 70 in what has previously been described as the VHF section. Since the gate 98 is open, the signal from the UHF mixer is all that is received by the first RF amplifier 70. The subsequent coupling through the second RF amplifier 72, the second mixer 66 and the above described mixing with the incoming local oscillator frequency, again having a specific frequency somewhere in the range of 15 to 35 MHZ according to the programmed frequency, is identical to the processing of the first described VHF signal.

The third case is, of course, when a specific frequency in the high band, i.e., 30 to 50 MHZ, is programmed. In this instance, the antenna gate 98 is again opened, and, due to the additional opening of a second gate 108, the first two RF amplifiers 70 and 72 are turned off. More specifically, the second gate 108, when open, is effective to remove the necessary bias voltage from the two amplifier stages 70 and 72 thereby eliminating, or blocking, any VHF or UHF signals from the remaining portions of the signal processing circuit.

Assuming that a high band frequency (HF) is programmed and that such a frequency is available at the antenna 74, such signal is supplied to a linear amplifier 110 for amplification and is thereafter available to a HF mixer 112. The other input to this mixer 112 is from the tuned linear amplifier 64 which, as above described, amplifies the 90 to 110 MHZ local oscillator frequency.

The output of the low band mixer 112 is a 60 MHZ signal which is then applied to the input of the 60 MHZ amplifier 76. Again, the subsequent processing of this signal to provide an audio output from the audio amplifier 92 is identical to that for the two bands previously described.

The description thus far has been limited to the monitoring and processing of frequencies to provide an audio output when a plurality of programmed frequencies contain a broadcasted signal. The actual programming and selection of the plurality of predetermined frequency signals which will cause an audio output is shown by the block diagram in FIG. 3. It should be understood that although a specific plurality of signals are programmed as the desired signals, these signals can be selected from any of the 12,000 channels in the entire HF, UHF and VHF bands which are monitored for reception. In other words, the inventive receiver has the capability, by changing the programmed frequencies, to select any channel, of 5 KHZ band width, in any of the three frequency bands.

Turning to FIG. 3, the basis for the scanning operation is an 80 HZ scanning oscillator 120 which is normally a free running clock. The 80 HZ signal from the scanning oscillator 120 is applied to a frequency divider 122 which, in the preferred embodiment, divides the 80 HZ signal into a 10 HZ signal. The 10 HZ signal is decoded by a decoder block 124 to sequentially apply pulses to the 10 output lines 126 of the decoder which are coupled to an 8 × 14 matrix switch 128. Again in the preferred embodiment, this 8 × 14 matrix switch is a so-called diode matrix which, when the respective diodes are appropriately connected, and a ground pulse is available on the appropriate one of the input lines 126, provides a combination of positive and negative signals, speaking in the binary sense, which are coupled in parallel to the programmable counters 38, first shown in FIG. 1 and repeated in FIG. 3 for clarity. The specific plurality of combinations of the diodes that are coupled to each of the input lines 126 from the decoder 124 by a conductive paint or the like, determine the number to which the respective stages of the programmable counters 38 will be programmed.

The diode matrix 128 is also used for selecting the particular band which the programmed frequency will be found in. In short, the diode matrix 128 is also coupled to the previously mentioned gates 98 and 108 which operatively select the frequency band which a particular signal is to be found in.

The output of the FM detector 86 (FIG. 2) which bears the squelch signal is coupled through an amplifier and delay circuit 130 to the scanning oscillator 120. The presence of a broadcast signal, as determined by the FM detector 86, causes the squelch line 94 to have a substantially ground signal imposed thereon. This signal is coupled to the squelch amplifier 130 and, due to the coupling of the amplifier to the scanning oscillator 120, inhibits the scanning oscillator. In other words, the scanning oscillator is free running until a broadcast signal is detected on one of the programmed frequencies and is immediately inhibited for the duration of that broadcast signal. After the termination of the broadcast signal, a delay inhibits the scanning oscillator for an additional period of time, so that in the event that there was only a momentary break in the broadcast, the receiver would not progress on to the next and subsequent programmed frequencies.

Figure 4:
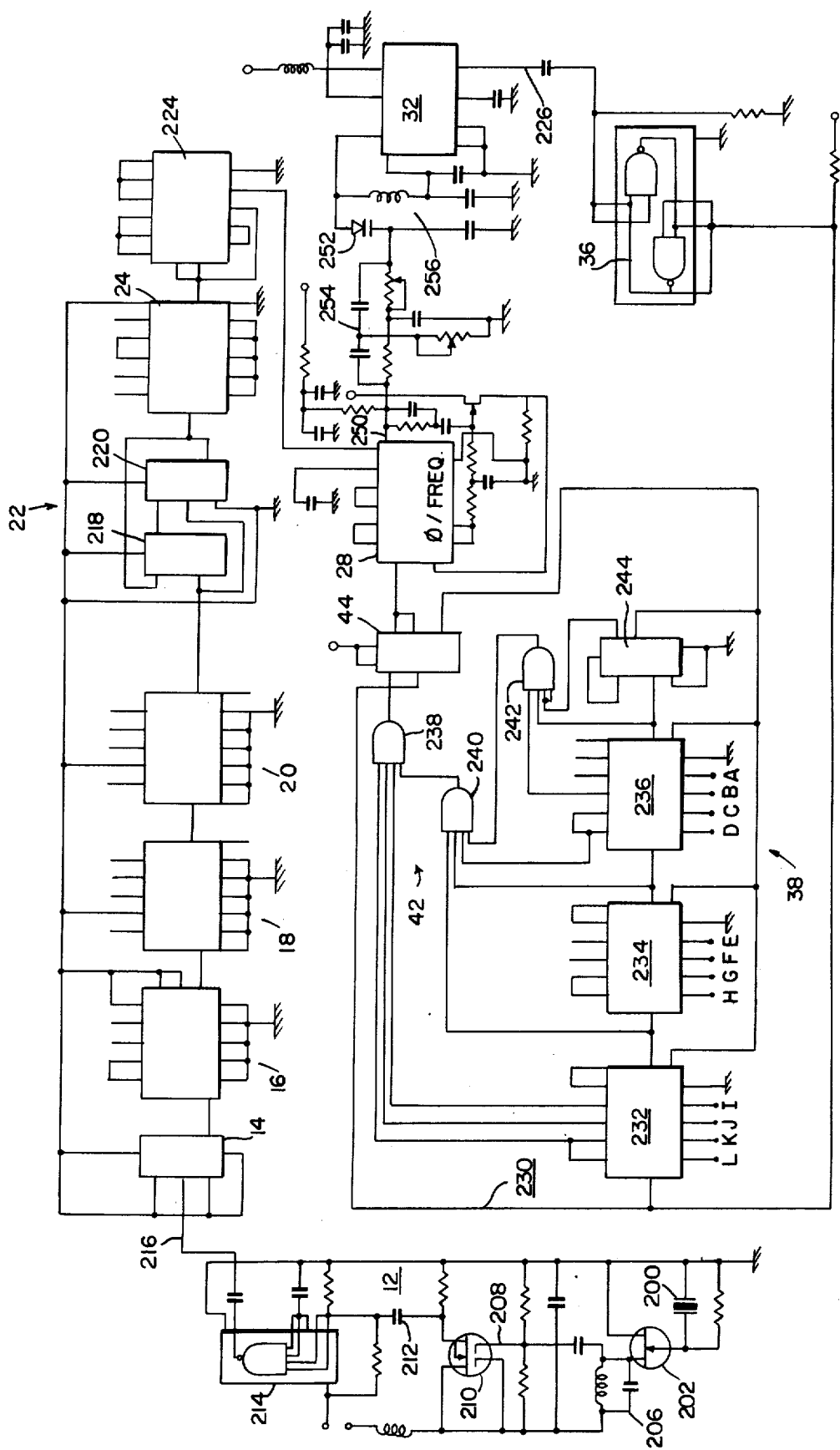
FIG. 4 is a circuit diagram of the electronic circuitry embodied in the block diagram of FIG. 1.

With reference to the block diagram of FIG. 1, the specific circuitry for the elements in the block diagram is shown in FIG. 4.

The 75 MHZ oscillator 12 is comprised of a crystal 200 which is connected in a parallel resonant mode with the gate terminal of a junction field effect transistor 202. The output of the FET 202 is taken from its source terminal which is tuned by a filter 206 and which is coupled to one gate 208 of a MOSFET 210. The MOSFET is utilized to electronically isolate the oscillators from subsequent components to prevent de-tuning of the oscillator. The output of the MOSFET 210 is coupled by a capacitor 212 to a linear amplifier 214 which provides the desired three or four volt swing in the 75 MHZ reference signal.

The output of the 75 MHZ oscillator is taken, by means of a conductor 216, from the linear amplifier 214 and is applied to a JK flip-flop 14 which comprises the divide by two element 14. The output of the JK FF 14 is a 37.5 MHZ signal and is coupled to a counter 16 which provides the divide by ten element 16. In essence, this counter is a sixteen bit counter which is used only to divide by ten.

The resulting 3.75 MHZ output from the divide by ten counter 16 is subsequently divided by five in a second counter 18 and is divided again by five in a third counter 20 to yield a 150 KHZ signal. The 150 KHZ signal is then divided by three by a pair of JK FF's 218 and 220 which are connected in a dividing mode to provide the three's divider 22. The 50 KHZ signal from the three's divider 22 is once again divided, this time by the tens divider counter 24 to provide the 5 KHZ signal which, as will be recalled, is used as a reference frequency signal.

The 5 KHZ reference signal is applied to the monostable multi-vibrator 26 which is comprised of a one-shot 224 for altering the duration of 5 KHZ pulses to approximately 50 NSEC. The one-shot 224 is coupled to the phase and frequency detector 28 for providing the basic reference signal frequency to the phase and frequency detector.

The voltage controlled oscillator 32 provides a signal frequency somewhere between 15 and 35 MHZ. The particular output frequency in this range, as explained in conjunction with FIG. 2, defines the particular frequency which will be received, processed, and broadcast by the receiver at any given instant of time. The specific frequency in the 15 to 35 MHZ range which is generated by the VCO is controlled by an output from the phase and frequency detector 28 in a manner now to be described.

The output of the VCO 32 is coupled by a conductor 226 to a linear amplifier which serves as the translator 36. The translator 36, i.e., the linear amplifier, is effective to translate the 0.75 volt amplitude signal from the VCO 32 to the amplitude of 2.5 volts that is necessary to clock the programmable counters 38 and the control FF 44.

In accordance with the above description, the output signal from the translator 36 is, when the receiver is first turned on, somewhere between 15 and 35 MHZ. This signal is coupled to the clocking input 230 of the first stage 232 of the three-stage programmable counter 38. In effect, each of these stages 232, 234 and 236 are programmable 4 bit counters. A flip-flop 244 forms the most significant bit of the binary count that is decoded by the decoders 42 but operates according to a so-called fixed or hard-wired program.

The programming inputs to the counter stages 232, 234 and 236 have been labeled A through L and come from outputs of the diode matrix switch 128.

The output of the VCO 32 is also coupled to the clock input of the control FF 44. The output of the VCO is thereby effective to clock the three programmable counter 38 stages 232, 234 and 236, as well as the control FF 44.

The programming lines A–L for the three counter stages 232, 234 and 236 are, in actuality, the preset lines for these respective counter stages. The particular combination at any given time, of ones, i.e., 12 volts, and of zeros, i.e., ground level, which are available on these preset lines A–L determine the count which is preset into the counter stages and from which point the counters will begin counting when clocked by the VCO signal frequency.

Outputs of the three counter stages 232, 234 and 236 are coupled, as shown, to three AND gates 238, 240 and 242 which decode the number 7057 each time the aggregation of the counter stages reaches this count. The hard-wired FF 244 is coupled to the last counter stage and to one of the AND gates 242 and is responsible for the most significant bit in the binarily represented 7057 that is presented to the decoding AND gates 238, 240 and 242.

In operation, then, each time the counters binarily count to 7057, the three AND gates 238, 240 and 242 detect this count and apply a positive signal to the control FF 44. Since the counter stages 232, 234 and 236 are being clocked by the output frequency of the VCO 32, and if it is assumed that all of the preset lines A–L have binary zeros imposed thereon by the diode matrix card 128, the output conductor of the control FF 44 should have approximately a 5 KHZ signal thereon. This can be computed, as with all zeros programmed on the present lines A–L, the counter stages must begin their count at zero and receive 7057 clock pulses from the VCO before the control FF 44 is pulsed once. In effect, then, the VCO output frequency is being divided by 7057 to obtain the 5 KHZ output from the FF 44. Five KHZ times 7057 equals 35.2 MHZ which is the highest frequency to be obtained from the VCO 32.

With all binary ones programmed on the preset lines A–L, the number 4096 is preset into the programmable counter 38. When clocked by the VCO, the counter begins its count at 4096 and is reset when it reaches 7057, as before. In this case, the VCO output frequency is divided by the difference between 4096 and 7057, which is equal to the lowest VCO frequency of 14.8 MHZ or approximately 15 MHZ.

The resetting of the programmable counter stages 232, 234 and 236 to zero or to the preset number is performed by a second output of the control FF 44 each time the FF 44 is pulsed thereby signifying that the count of 7057 has been reached.

Assume for the sake of description that the overall receiver has just been turned on. At that time, it would be unknown as to what frequency was coming from the VCO 32. Assume further that all 1's are programmed on the program lines A–L. If the signal from the VCO does not have a frequency of 15 MHZ, the output of the control FF 44 will either be greater or less than 5 KHZ. The phase and frequency detector 28, which has the reference 5 KHZ signal applied to it, also receives the output of the control FF 44. In the event that the output of the control FF is greater than 5 KHZ, an output conductor 250 from the phase and frequency detector 28 would have a positive DC voltage imposed thereon. The magnitude of this voltage is directly proportional to the difference in frequency between the 5 KHZ reference signal and the signal coming from the control FF 44. This DC voltage now becomes the control voltage for the VCO 32.

More specifically, the output conductor 250 from the phase and frequency detector 28 is coupled to a varactor 252 by means of a notch filter 254. This notch filter eliminates any 5 KHZ signal on the DC signal from the detector 28 so that the voltage applied to the varactor 252 is substantially a pure DC.

The varactor 252 forms part of a parallel resonant circuit 256 which determines the frequency at which the VCO will oscillate. A change in the voltage that is applied to the varactor 252 changes the capacitance of the varactor to thereby effect the change in the frequency to which the VCO is tuned.

The resulting change in the frequency of the VCO's output will, if it has been reduced, cause the programmable counters 38 and the control FF 44 to be clocked at a slower rate which continues to rapidly home in on and stabilize at 5 KHZ.

The output of the VCO 32 is thereby regulated, via the phase and frequency detector 28, by the particular combination of 1's and 0's which are preset into the programmable counters 38. As will be seen, these programmed numbers also constantly change, on the order of ten times a second. The output of the VCO is, according to the above description, somewhere between 15 and 35 MHZ. The specific frequency has now been determined and has been set by the programmable counters 38 and the phase and frequency detector 28. Furthermore, the specific frequency from the VCO, as will now be seen, establishes the frequency to which the radio receiver is tuned in an effort to detect a broadcast signal on that frequency.

With reference to FIG. 5, the output conductor 230 from the linear amplifier and translator 36 is applied to the first mixer 60, as well as to the counter 38 and the control FF 44. The other input of this mixer 60 is from the 75 MHZ oscillator 12 by conductor 216. A MOSFET 270 forms the basis for the mixer 60, and has a tuned output with a center frequency of 100 MHZ. The frequency output of the first mixer 60 is thereby in the range of 90 to 110 MHZ.

The 90 to 110 MHZ signal is coupled by a tuned tank circuit 272 to a linear amplifier 274. The amplifier 274 has a tuned output that is again 90 to 110 MHZ with a now substantially increased amplitude. This 90 to 110 MHZ signal will hereinafter be referred to as the local oscillator frequency. Its specific frequency within the 90 to 110 MHZ range establishes the particular channel or frequency to which the receiver will be tuned to receive from the antenna 74. Again, there are 4,000 possible channels in each of the three bands, thereby making a total of 12,000 possible channels or frequencies which can be programmably received.

The local oscillator frequency is coupled by a capacitor 276 to the second gate 278 of a dual gate MOSFET 280 which forms the basis of the second mixer 66.

The circuitry and processing for a signal in the VHF band will first be described assuming, of course, that the VHF band has been programmed, in a manner still to be described.

In the VHF mode, the input to the first gate 282 of the MOSFET 280 in the second mixer 66 is received, after substantial amplification, from the antenna 74. More specifically, the antenna 74 is coupled through a parallel tuned filter 284 to the first gate 354 of a dual gate MOSFET 286 which comprises, along with its associated filters and circuitry, the first RF amplifier stage 70. The first and second RF amplifier stages 70 and 72 are stagger tuned and both are comprised of MOSFETS connected within their respective stages in an enhancement mode. The output of the first RF amplifier 70 is coupled by a capacitor 288 to the second RF amplifier 72. The output of the second RF amplifier 72 is likewise coupled by a capacitor 290 and a parallel resonant circuit 292 to the first gate 282 of the MOSFET 280 in the second mixer 66.

The VHF band has a frequency range of between 150 and 170 MHZ. The mixing of this signal, when received by the antenna 74, with the local oscillator frequency in the second mixer, is effective to generate a 60 MHZ signal which passes through a single tuned resonant circuit 294 before being applied to the 60 MHZ amplifier 76. The 60 MHZ signal will only be generated when a VHF signal of the proper frequency is received that is in the proper proportion to the local oscillator frequency. The programmed local oscillator frequency is thereby controlling the frequency to be monitored for a broadcast signal.

The output of the 60 MHZ amplifier is coupled to the third mixer 78 which receives its other input from the 55.5 MHZ oscillator 80. The 55.5 MHZ oscillator is comprised of a parallel resonant crystal 296 and a junction type FET 297 which provides the wave shaping required.

The output of the third mixer has a frequency of 4.5 MHZ and is applied by the 4.5 MHZ crystal filter 84 to the input of the FM detector 86. To reiterate, the 4.5 MHZ crystal filter 84 is used to eliminate adjacent channel problems and has been found to be very important since the 4,000 possible channels in each band are only separated in increments of 5 KHZ.

The first portion of the FM detector 86, which is included in the integrated circuit making up the FM indicator, is an amplifier stage which provides on the order of 80 db of gain. The FM detector detects the presence of the broadcast information that is modulated on the 4.5 MHZ signal and makes an audio signal in the frequency range of 60 HZ to 5 KHZ available on an output conductor 300. The subsequent audio processing and presentation of this signal will be later described in conjunction with FIG. 6.

The FM detector 86 also provides an automatic gain control (AGC) signal on second output conductor 302. This AGC signal is a DC voltage which is amplified by two DC amplifiers 304 and 306 before being applied to the second gates 308 and 310 of the dual gate MOSFETS 312 and 286 contained in the first and second RF amplifiers 70 and 72. The AGC voltage level is increased as the point of saturation of the FM detector increases. The net effect of the AGC signal is to proportionately reduce the gain of the first and second RF amplifiers 70 and 72.

The selection of the specific frequency band, i.e., HF, VHF or UHF, which will be monitored for a specific signal frequency, is selected by programming the diode matrix 128. The selection of the VHF band is made by the application of a zero voltage by the matrix 128 to the base conductor 320 of a transistor switch 322 to turn that switch 322 on. At the same time, a second transistor switch 324 is turned off by the application of a one, i.e., a positive voltage, to its base conductor 326 which turns off the bias voltage for the doublers 106, the mixer 102 and the amplifier 100 in the UHF portion of the receiver. Turning the second transistor switch off also, by means of a direct coupling, causes a third transistor switch 328 to also be turned off, thereby also eliminating the bias voltage from the HF portion of the receiver.

Assume for the sake of description, that a frequency is programmed and, furthermore, that the desired frequency is to be found in the UHF band and that the UHF band is accordingly programmed. The first transistor switch 322 would remain on and the second and third transistor switches would be turned on. The now conductive second transistor switch 324 removes the bias voltage from a fourth transistor switch 330 to render that switch non-conductive, which in turn opens a diode 332 in the parallel resonant circuit 284 which couples the antenna 74 to the first RF amplifier 70 in the VHF section.

The incoming signal from the antenna 74 is now available to the UHF amplifier 100 through a now conductive diode 334. The actual input to the UHF amplifier 100 is through a tuned filter 335 having an approximate center frequency of 460 MHZ which is sufficient to accept the incoming signal having a range of 450 to 470 MHZ. Again, the UHF amplifier 100 is a dual gate MOSFET. The drain 336 of this MOSFET 338 is coupled by tuned tank circuits 340 to the first gate 342 of a MOSFET 344 in the UHF mixer 102.

The other gate of the MOSFET 344 is supplied with an incoming signal of 300 MHZ from the two doubler circuits 106 and 107. As previously mentioned, the input to the first 107 of these doubler circuits is obtained directly from the 75 MHZ oscillator 12. The first doubler 107 is effective to double the 75 MHZ frequency to 150 MHZ, which then passes through the second doubler 106 to obtain the 300 MHZ signal that is supplied to the second gate 346 in the UHF mixer MOSFET 344. The output conductor 348 from the UHF mixer 102 is coupled by a capacitor 350 to a tuned circuit 353 which serves as the input device for the first gate 354 in the MOSFET 312 of the first RF amplifier 70 in what has heretofore been the VHF processing amplifiers.

The output signal from the UHF mixer 102 is, by virtue of the inputs to the UHF mixer, in a frequency range of 150 to 170 MHZ. Thus, a pseudo VHF signal has been generated which represents a UHF frequency. The subsequent processing, i.e., amplification, mixing and filtering are identical for the UHF signal to that previously described for the VHF band.

The programming of the high frequency (HF) band, i.e., 30 to 50 MHZ is effective to permit the second and third transistor switches 324 and 328 to remain on and is further effective to turn the first transistor switch 322 to its non-conductive state. The latter action removes the DC bias voltage from the first and second RF amplifiers 70 and 72, thereby rendering them inoperative and, in accordance with the previous description, inhibits the reception of a VHF or a UHF signal.

The reception of a HF signal by the antenna 74, when a high frequency signal is programmed, is amplified by two stagger tuned linear operational amplifiers 360 and 362 which comprise the linear amplifier 110 whose output is coupled to the HF band mixer 112. The local oscillator frequency coming from the first mixer 60, and thereafter the linear amplifier 64, is used as the other input to the HF mixer 112. As the first input is always 30 to 50 MHZ and the second, i.e., the local oscillator frequency is always 90 to 110 MHZ, the output conductor 364 from the HF mixer 112 is always, when a HF signal is programmed and present, 60 MHZ.

The HF mixer 112 is coupled by its output conductor 364 to the input of the tuned 60 MHZ amplifier 76. The subsequent processing of the so-called HF signal is indentical to that performed on the VHF and UHF signals from the 60 MHZ amplifier 76 through the audio amplifier 92.

The squelching of unwanted noise signals and the actual programming circuitry used to program the programmable counters 38 will now be described in conjuction with FIG. 6, and with reference to FIG. 3.

When a broadcast is being received at a programmed frequency and in a programmed band, the output conductor 300 from the FM detector 86 of FIG. 5 will have a 60 HZ to 5 KHZ signal imposed thereon. The audio output conductor 300 is coupled by a capacitor 370 to a notch filter 372 which removes frequencies in the range of 300 to 350 HZ from the audio signal. This notch filter 372 has been found necessary due to the generation of signals of this frequency, which it appears occurs due to the constantly changing output frequency of the VCO 32. The output of the notch filter passes through a first-stage pre-amplifier 374 in the pre-amp 90 to compensate for the insertion losses in the audio signal which are incurred by the notch filter 372.

The output of the first-stage pre-amp 374 then passes to a second stage pre-amp 376 which is tuned to pass low frequencies. The output conductor 378 of the second pre-amp 376 is coupled to the audio frequency amplifier 130 by a volume control potentiometer 380. The audio amplifier 130 is in turn coupled by a capacitor 382 to the speaker 131.

Figure 6:
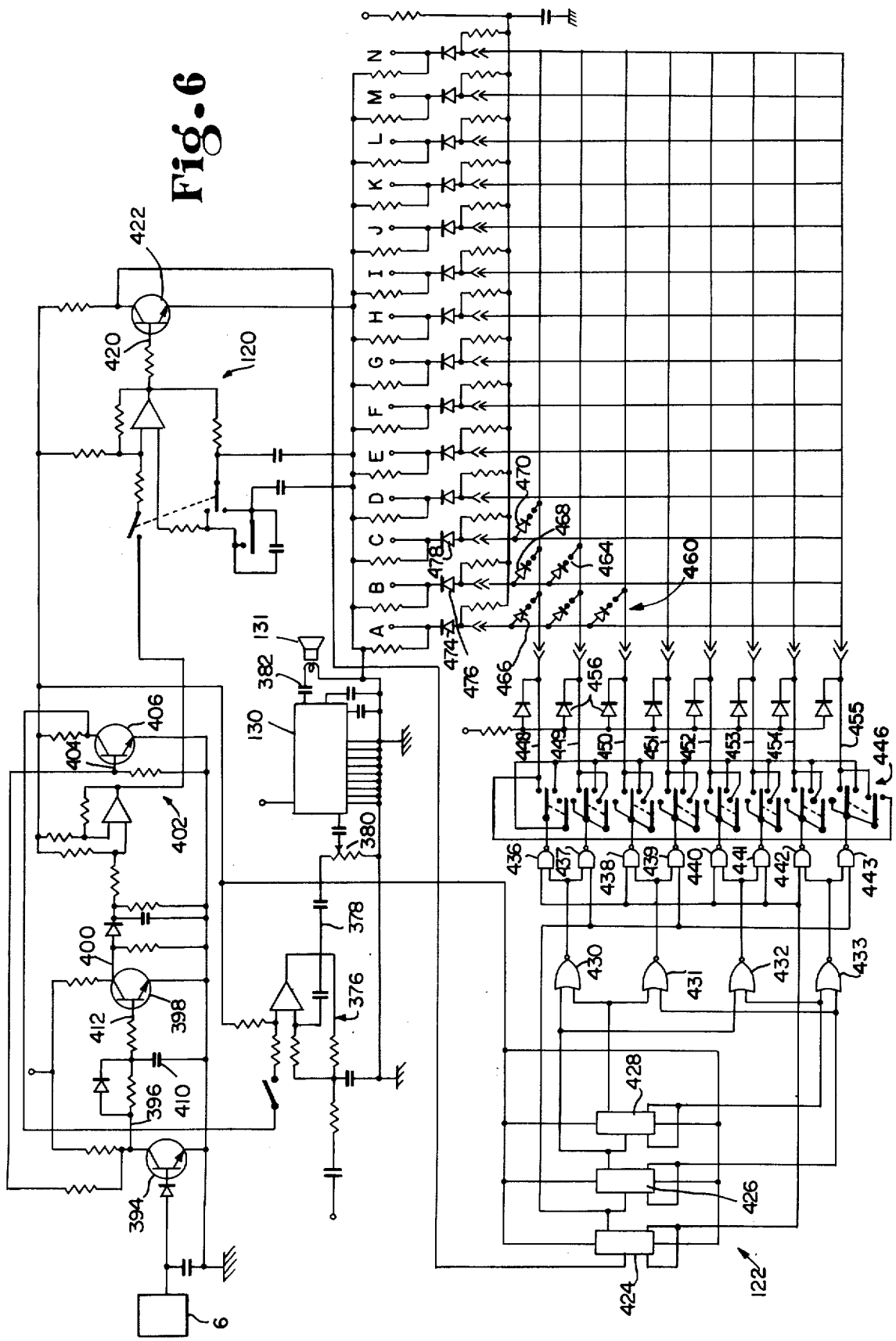
FIG. 6 is a circuit diagram showing the electronic circuits embodied in the block diagram of FIG. 3.

In the event that only noise is present on the programmed frequency band and, more specifically, on the programmed frequency within that band, another output conductor 390 receives a positive voltage from the FM detector 86 which passes through a squelch level potentiometer 392 before being coupled to a first squelch transistor switch 394 as shown in FIG. 6.

The presence of the squelch signal, i.e., a positive voltage on FM detector output conductor 390, is effective to turn the first transistor switch 394 in the squelch circuit to its on state.

The collector 396 of the first squelch transistor switch 394 then goes to a ground level potential which is coupled to turn a second transistor switch 398 to its off state.

The collector 400 of the second squelch switch 398 then goes to a positive voltage, such voltage then passing through a squelch amplifier 402 where the signal is amplified and is used as the input to the scanning oscillator 120.

This oscillator 120 is, as previously mentioned in conjunction with FIG. 3, outputting an 80 HZ signal which is used to clock the frequency divider 122. In operation then, the scanning oscillator 120 clocks the frequency divider 122 when there is no broadcast signal being received in a programmed band frequency.

It has been found desirable to eliminate the audio output to the speaker 131 during the absence of a programmed broadcast signal. Accordingly, the collector 396 of the first squelch transistor switch 394 is coupled to the base 404 of a third transistor 406 in the squelch circuit. The latter transistor 406 thereby is turned on and is saturated when there is no broadcast signal, i.e., when there is a positive squelch signal coming from the FM detector 86. The collector of this squelch activated transistor 406 is coupled to the input of the second pre-amp 376 in the audio circuit and renders this pre-amp and thereby the audio amplifier 130 inoperative when the transistor 406 is conductive.

When the FM detector 86 detects a broadcast signal on a programmed frequency band, the squelch signal on output conductor 390 is removed, thereby causing the first squelch transistor switch 394 to go off, the second squelch transistor switch 398 to go on and the output of the squelch amplifier 402 to go low. This removes the voltage source to the scanning oscillator 120. The result is that the scanning oscillator stops the scanning process thereby enabling the broadcast of the signal which has been received by the FM detector for the duration of that signal. It should also be mentioned that turning the first squelch transistor switch 394 to its non-conductive state removes the inhibit from the second audio pre-amp 376 which then permits the broadcast signal to be heard via the speaker 131.

A delay capacitor 410 is connected in parallel with the base 412 of the second squelch transistor 398. This capacitor is rapidly charged when the collector 396 of the first squelch transistor 394 goes high to indicate that no squelch signal is present and a broadcast signal is being received. At the conclusion of the broadcast signal, and as above explained, the collector 396 of the first squelch transistor 394 goes low which, in theory, should permit the scanning oscillator 120 to continue scanning. However, there is the possibility that the broadcast signal was only being interrupted momentarily, and, to permit instantaneous scanning at the conclusion of a signal could possibly cause the remainder of a broadcast signal, which was being subjected to momentary interruptions, to go unheard. The delay capacitor 410 obviates this problem, as it slowly discharges through the base 412 of the second transistor 398 after a squelch signal has been generated by the FM detector 86. The relatively slow decay time of this capacitor 410 is sufficient to permit the collector 400 of the second squelch transistor 398 to remain low for, say 1½ seconds, before the second transistor 398 is turned off.

Turning now to the scanning oscillator 120, the output of the oscillator 120 is coupled to the base 420 of a transistor limiter 422 which provides the necessary 0–5 volt swing in the 80 HZ signal to clock the frequency divider 122.

The frequency divider 122 is comprised of three FF's 424, 426 and 428 which are coupled together to divide the 80 HZ frequency down to 10 HZ. The outputs of the three divider FF's 424, 426 and 428 are appropriately coupled to four NOR gates 430–433 and to eight NAND gates 436–444 for decoding the 10 HZ signal into repetitive sequential signals each having a duration of 0.1 of a second.

The outputs of the eight NAND gates 436–444, when the scanning oscillator 120 is running, are sequentially turned off, i.e., taken to ground level, once each 0.8 seconds.

The outputs of these NAND gates 436–444 are coupled by a tandem switch 446 to the input lines 448–455 of the diode matrix card 128.

The input lines 448–455 of the diode matrix card 128 are also coupled by means of individual light emitting diodes 456 to a positive voltage supply. As their respective input lines 448–455 sequentially go to ground the light-emitting diodes sequentially conduct, thereby signifying that the associated input line has been turned off by the scanning process.

The diode matrix 128 is comprised of a plurality of diodes 460 which are connected to form the 8 × 14 matrix 128 that is utilized in the preferred embodiment. For purposes of clarity and dexcription, only six of the diodes are illustrated in FIG. 6, but it is to be understood that the remainder of the diodes are present and are connected in identical fashion with those that are shown.

The specific diodes are programmed, i.e., coupled to the respective matrix input lines 448–455 by closing normally open contacts 464 leading from the cathode of each diode to the respective input lines 448–455. In practicing the invention, these normally open contacts 464 are typically bridged by conductive silver ink or the like. The three diodes 466, 468 and 470 associated with the first input line 448 are shown as being bridged, while the three diodes that are illustrated, two being associated with the second input line 449 and one being associated with the third input line 450 are shown as being unbridged.

In operation, and assuming as indicated above that the first three diodes 466, 468 and 470 associated with the first input line 448 are connected to such input line and, further, that the remaining diodes associated with the first input line 448 remain unconnected, only the first three outputs A–C to the programmable counters 38 will be grounded, and the remaining lines D–L will remain at a high voltage level when the first input line is grounded. It should be seen, now, that this establishes a binary code consisting of three zeros and nine ones.

More specifically, and to further explain the operation of the diode matrix 128, when the first input line 448 is grounded, the first three diodes 466, 468 and 470, to continue the example, are rendered conductive thereby pulling the anodes of the diodes to a ground level. This removes the forward bias voltage for three other diodes 474, 476 and 478 which are coupled between the programmable counter preset lines and the above mentioned anodes.

The above output of the diode matrix card 128 and which according to the example consists of three zeros and nine ones, is present for only the one-tenth of a second that the first input line 448 is grounded. The scanning oscillator 120, as previously explained, causes, after a frequency division and decoding, the sequencing of the voltages that are applied to the input lines 448–455 of the diode matrix 128. Assuming a base time of 0, at 0.1 seconds, the first input line 448 goes to ground and the other lines 449–455 remain at a high voltage.

At 0.2 seconds the second input line 449 then goes to ground and all the others (448, 450–455) remain high. At this time, all diodes which have their cathodes bridged to the second input line 449 cause the associated output lines A–L to operatively go to ground. This establishes a second binary code on the output lines A–L which is indicative of a second programmed frequency. It should now be understood that the sequencing of the input lines 448–455 to the diode matrix 128 causes a different binary combination to be present on the output lines A–L as each of the input lines are respectively grounded by the scanning oscillator 120.

The thirteenth and fourteenth output lines M and N of the diode matrix are used to generate a two bit code which controls the first and second transistor switches 322 and 324 used in the circuit of FIG. 5 for alternatively determining the particular band in which the programmed frequency, indicated by the binary combination on output lines A–L, is to be found. More specifically, the bridging of the diode contacts 464 that are associated with the M and N output lines to any of the input lines 448–455, causes the respective output line M and/or N to be grounded when the input line associated therewith is grounded. In accordance with the description of FIG. 5, the grounding of only the M output causes the first transistor switch 322 to be turned on and thereby supplies bias voltage to the first two RF amplifiers 70 and 72. As the N output line remains ungrounded, the second switch 324 remains non-conductive thereby removing the bias voltage from the UHF and the HF circuits.

In operation, then, predetermined ones of the diode matrix diodes 460 have their cathodes coupled by conductive paint or the like to a respective matrix input line 448-455. The receiver is turned on, and the scanning oscillator 120 begins generating its 80 HZ signal. This frequency is divided and decoded by the frequency divider 122 and the decoder 124 to sequentially ground each of the diode matrix input lines 448-455 in repetitive fashion. Each of the input lines is thereby grounded for 0.1 of a second. During the time when each of the input lines 448-455 is grounded, a predetermined combination of binary significant ones and zeros is available on the output lines A-L leading to the preset lines A-L of the programmable counter stages 232, 234 and 236 (FIG. 4). Thus, a different combination of ones and zeros, representing a different binary number, can be presented and preset into the programmable counter stages 232, 234 and 236 of FIG. 4 each time a different diode matrix input 448-455 goes to ground.

In effect, each binary combination available to the preset lines A-L of the programmable counter, presets a different number into such counter stages. It should now be seen that during each 0.1 second time period, a different output frequency from the VCO 32 is established and generated. For the sake of description, it is assumed that each of the eight input lines to the diode matrix switch contain a different combination of bridged diodes, although two or more of them could be identical.

Again, during each 0.1 second time period, the VCO 32 is caused by the programmable counters 38, acting in conjunction with the phase and frequency detector 28, to have a different output frequency. This output frequency, somewhere in the range of between 15 and 35 MHZ, is then mixed with the 75 MHZ oscillator output to form the 90 to 110 MHZ local oscillator frequency.

If the desired frequency is in the VHF band, the diode 460 on the diode matrix card 128 that is associated with the respective grounded input line 448-455 and that is also associated with the M output line is placed or programmed into circuit so that the M output line goes to ground.

The grounding of the M output line causes the first transistor switch 322 to go on thereby supplying bias voltage to the first and second RF amplifiers 70 and 72. This enables an incoming VHF signal to be amplified and, if such signal is at the desired frequency, the second mixer 66 will have the required 60 MHZ signal output to enable the subsequent processing of the signal and its broadcast from the speaker 131. If a VHF signal is received by the antenna 74 but is not at the proper frequency, no broadcast will be made.

If the desired frequency is in the UHF band, both the M and N diodes are bridged to the matrix input line where the desired frequency is programmed to turn on both the switches (FIG. 5) 322 and 324. Programming of the HF band is accomplished by bridging only the N diode to the appropriate input line 448-455.

All of the above counter-programming, selection of HF, VHF or UHF bands and VCO frequency output takes place each 0.1 of a second.

In the event that a signal, at the programmed frequency, is indeed present at the antenna 74 and contains a broadcast, the described squelch circuitry will halt or inhibit the scanning oscillator 120 until 1.5 seconds after the termination of such broadcast so that it can be heard from the speaker 131. At that time, the scanning will continue to progressively step through each of the programmed frequencies designated by the diode matrix card 128 to look, for a period of 0.1 of a second, for an incoming signal from the antenna 74 having the respective programmed frequency, in the programmed band and containing a broadcast.

The above description, taken in its entirety, describes an automatically scanning and seeking radio frequency receiver which can synthesize all of the frequencies in the HF, VHF and UHF frequency bands and which has the ability to stop the scanning process when any one of a plurality of predetermined frequencies is obtained and which carries a broadcast signal.

Furthermore, the described receiver utilizes a singular antenna to effectively receive signals in any one or all of the three radio bands.

What we claim as our invention is:

1. A programmable signal seeking radio receiver, comprising programmable electronic circuit means for predeterminably selecting a plurality of radio frequencies for reception and for generating a plurality of coded outputs each corresponding with one of said selected frequencies; programmable frequency generation means having reference frequency source means with an output coupled to frequency and phase detector means, said frequency and phase detector means having an output coupled to controlled oscillator means having programmable frequency counting means coupled in feedback loop configuration therewith; said counting means being coupled to and responsive to the coded outputs of said electronic circuit means for generating frequencies at an output of said controlled oscillator means in accordance with said coded outputs; an antenna; radio frequency amplifying and mixing means coupled between said antenna and said controlled oscillator means for determining when said antenna receives one of said selected frequencies; scanning means coupled to said programmable electronic circuit means for causing said coded outputs to be continuously coupled sequentially to said counting means whereby the generated frequency at the output of said controlled oscillator means is sequentially altered by said scanning means; and inhibitor means coupled between said amplifying and mixing means and said scanning means for inhibiting said scanning upon detection of a broadcast signal on one of said selected frequencies and for removing the inhibit upon termination of said broadcast signal.

2. A programmable signal seeking radio as set forth in claim 1 wherein said programmable electronic circuit means comprises a programmable matrix circuit.

3. A programmable signal seeking radio as set forth in claim 1 wherein said radio frequency amplifying and mixing means comprises a plurality of conductive paths each corresponding with one of a plurality of radio frequency bands in which one or all of said selected frequencies are found, said programmable electronic circuit means including means responsive to said scanning means for selecting one of said conductive paths according to the particular one of said selected frequencies to be received each time one of the coded outputs is coupled to said counting means.

4. A programmable signal seeking radio as set forth in claim 1 with the addition of speaker means coupled to said amplifying and mixing means for broadcasting a broadcast signal on one of said selected frequencies when said scanning means is inhibited, said inhibitor means being also coupled to said speaker means for turning off said speaker means when no broadcast signal on one of said selected frequencies is detected.

5. A programmable signal seeking radio as set forth in claim 1 wherein said inhibitor means includes time delay means for removing the inhibit of said scanning means a short duration after termination of the broadcast signal detected on one of said selected frequencies.

6. A programmable frequency generation circuit comprising programmable electronic circuit means for predeterminably selecting a plurality of frequencies and for generating a plurality of coded outputs each corresponding with one of said selected frequencies; programmable frequency generation means having reference frequency source means with an output coupled to frequency and phase detector means, said frequency and phase detector means having an output coupled to controlled oscillator means having programmable frequency counting means coupled in feedback loop configuration therewith, said counting means being coupled to and sequentially responsive to the coded outputs of said electronic circuit means for sequentially generating one of said selected frequencies; and scanning means coupled to said programmable electronic circuit means for causing said coded outputs to be coupled sequentially to said counting means whereby the generated selected frequency at the output of said controlled oscillator means is sequentially altered.

* * * * *